United States Patent

Mori

[11] Patent Number: 6,091,481
[45] Date of Patent: Jul. 18, 2000

[54] POSITIONING METHOD AND PROJECTION EXPOSURE APPARATUS USING THE METHOD

[75] Inventor: Tetsuya Mori, Utsunomiya, Japan

[73] Assignee: Canon Kabushiki Kaisha, Tokyo, Japan

[21] Appl. No.: 08/916,926

[22] Filed: Aug. 22, 1997

[30] Foreign Application Priority Data

Aug. 27, 1996 [JP] Japan .................................... 8-244138

[51] Int. Cl.[7] .......................... G03B 27/54; G03B 27/42; G01B 9/02; G03F 9/00
[52] U.S. Cl. .............................. 355/67; 355/53; 356/349; 430/22; 348/87
[58] Field of Search .................................. 355/53, 67, 71; 356/399, 400, 401, 349; 430/22; 348/87, 94, 95

[56] References Cited

U.S. PATENT DOCUMENTS

| | | | |
|---|---|---|---|
| 4,710,026 | 12/1987 | Magome et al. ........................ | 356/400 |
| 5,268,744 | 12/1993 | Mori et al. ............................... | 356/400 |
| 5,309,197 | 5/1994 | Mori et al. ................................ | 355/53 |
| 5,486,919 | 1/1996 | Tsuji et al. ............................... | 356/349 |
| 5,498,878 | 3/1996 | Hasegawa et al. ....................... | 250/548 |
| 5,568,257 | 10/1996 | Ota et al. .................................. | 356/401 |
| 5,574,556 | 11/1996 | Mori et al. ................................ | 356/244 |
| 5,594,549 | 1/1997 | Mori et al. ................................ | 356/401 |
| 5,734,478 | 3/1998 | Magome et al. ......................... | 356/401 |
| 5,796,483 | 8/1998 | Nakayama ............................... | 356/401 |

FOREIGN PATENT DOCUMENTS 5343291 12/1993 Japan .

Primary Examiner—Safet Metjahic
Assistant Examiner—Peter B. Kim
Attorney, Agent, or Firm—Fitzpatrick, Cella, Harper & Scinto

[57] ABSTRACT

A positioning method for placing an object at a required position includes the steps of illuminating a grating mark formed on the object with a light beam from a light source, forming a mark coherent image corresponding to the grating mark on the surface of an image pickup means by using $\pm n$-order light (n=1, 2, 3, . . . ) of reflected and diffracted light from the grating mark and superimposing a reference coherent image of a reference mark, having different periodicity from and no interfering connection with the mark coherent image, onto the image pickup means, and selecting a spatial frequency component of a beat signal inherent in a composite video signal formed by superimposition and detecting the position of the grating mark on the basis of the phase of the spatial frequency component.

18 Claims, 4 Drawing Sheets

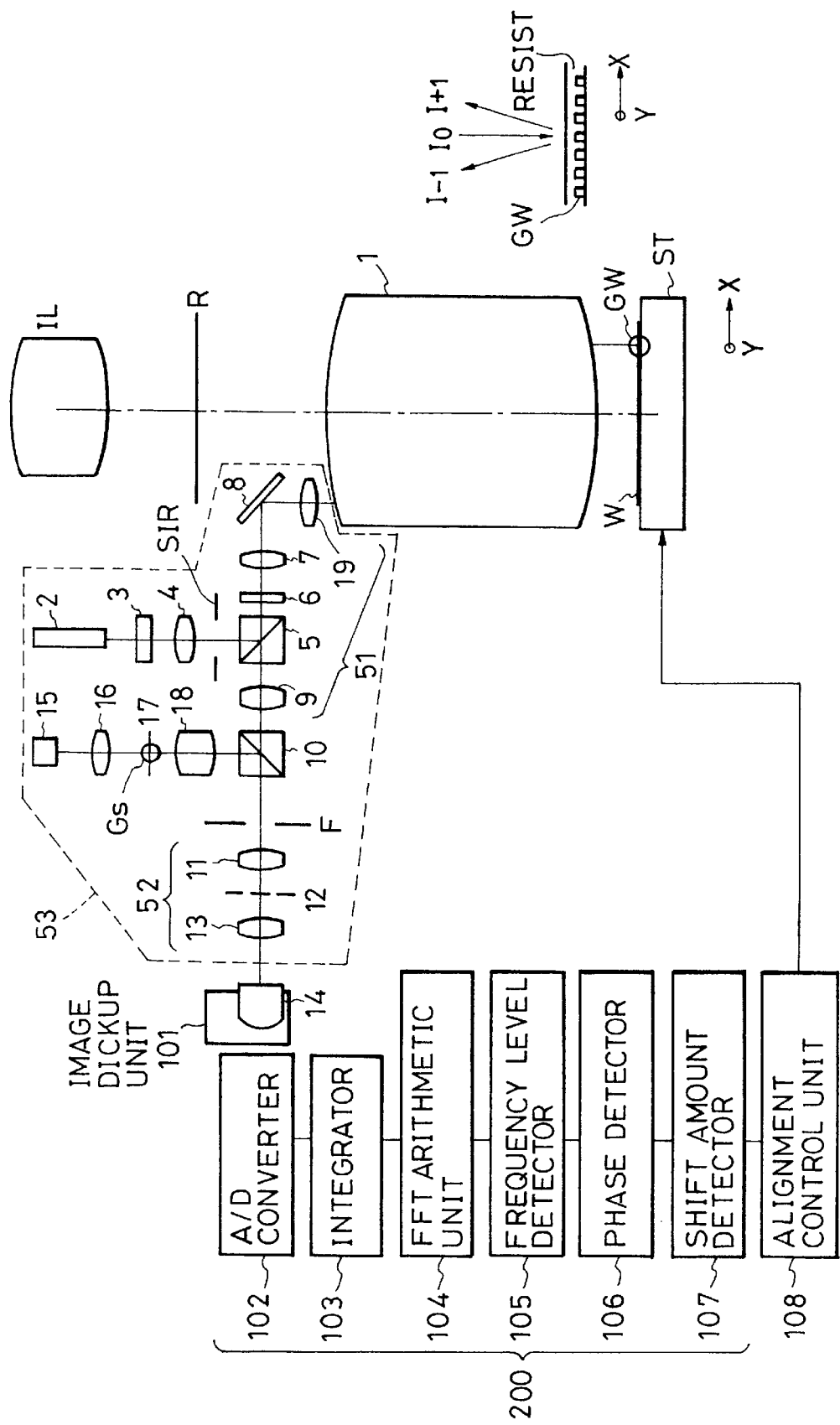

POSITIONING METHOD AND PROJECTION EXPOSURE APPARATUS USING THE METHOD

BACKGROUND OF THE INVENTION

1. Field of the Invention

The present invention relates to a positioning method for use in manufacturing a semiconductor device and a projection exposure apparatus using the method, and more particularly, to a positioning method for use in manufacturing a highly integrated semiconductor device, which method aligns, with high precision, a wafer and an image pickup means in synchronization (i.e. alignment) with a reticle in conjugate connection with the wafer by utilizing a coherent image generated based on reflected and diffracted light from a periodic grating mark (wafer mark, alignment mark) formed on the wafer.

This invention also relates to a method and apparatus for detecting the position of an object for use in its positioning.

2. Description of the Related Art

In recent years, semiconductor device manufacturing technology has progressed remarkably, and so has micromachining technology associated therewith. In particular, optical machining technology has reached the level of micromachining technology having a submicron resolution since the manufacturing of one megabyte display random access memory (1MDRAM) semiconductor devices began.

As microminiaturization of ICs (integrated circuits) and LSIs (large-scale integrated circuits) has advanced and the degree of integration of these semiconductor devices has increased year after year, the tolerance of alignment of a mask pattern and a photosensitive substrate pattern has become more exacting. In a well-known method, a reticle and a photosensitive substrate, such as a wafer are aligned with each other according to positional information on the wafer. Various methods of observing an alignment mark on the wafer have been proposed heretofore.

The present applicant has proposed, in Japanese Patent Laid-Open No. 5-343291, a method having high measuring power which adopts a coherent image formed based on reflected and diffracted light from a periodic grating mark on the surface of a wafer as a television image and employs phase detection using FFT (fast Fourier transform) processing.

Microminiaturization of semiconductor devices has recently advanced, and it is important for a projection exposure apparatus to align the reticle and the wafer with high precision in order to increase the degree of integration of these semiconductor devices. In order to achieve highly precise alignment by using the television image obtained by the image pickup means, it is necessary to raise the observing and imaging magnification for the wafer surface to be observed.

However, if the imaging magnification increases, the light intensity of a detection signal decreases. For example, when the magnification is doubled to double the measuring power, the light intensity is reduced to half in a line sensor, or to quarter in a two-dimensional CCD (charge-coupled diode). An insufficient amount of light is likely to cause detection failure and this impedes highly precise detection.

SUMMARY OF THE INVENTION

Accordingly, it is an object of the present invention to provide a method for use in positioning an object which aligns with high precision an image pickup means in synchronization (i.e. alignment) with a reticle and an object by utilizing a beat signal generated based on a mark formed on an appropriately set object surface without increasing the observation magnification of an observation optical system for the object surface, and a projection exposure apparatus using the positioning method.

It is another object of the present invention to provide a positioning method which finds positional information on a wafer mark GW by simultaneously forming a coherent image M of the wafer mark GW and a coherent image Ms of a mark Gs on a solid-state image pickup device, obtaining a superimposed signal image Mb through superimposition of signal intensities thereof, and detecting phase difference of the frequency of a beat signal of the signal image Mb in FFT processing, improves detection power by using the beat signal without raising the observation magnification of a detection system for the wafer surface, and achieves highly precise alignment without impairing the signal strength of the coherent image M of the wafer mark GW and causing the lowering of the detection precision owing to insufficient light amount, and to provide a projection exposure apparatus using the positioning method.

This invention also relates to a method and apparatus for detecting the position of an object for use in its positioning.

In order to achieve the above objects, the present invention provides a method for use in placing an object at a required position, the positioning method comprising the steps of illuminating a grating mark formed on the object with a light beam from a coherent light source, forming an object mark coherent image corresponding to the grating mark on the surface of an image pickup means by using ±n-order light (n=1, 2, 3, . . . ) of reflected and diffracted light from the grating mark and superimposing a reference coherent image of a reference mark, having different periodicity from and no interfering connection with, the object mark coherent image, onto the image pickup means, selecting a spatial frequency component of a beat signal inherent in a composite video signal formed by the superimposition, and detecting the position of the grating mark on the basis of the phase of the spatial frequency component.

The method further comprises the step of placing the object at the required position by using the object mark coherent image before projecting the reference coherent image onto the image pickup means.

The present invention also provides a projection exposure apparatus for projecting a pattern formed on a first object onto a second object with exposure light through a projection optical system, the projection exposure apparatus comprising an illuminating means for illuminating a grating mark formed on the second object, a forming means for forming a mark coherent image corresponding to the grating mark on the surface of an image pickup means by using ±n-order light (n=1, 2, 3, . . . ) of reflected and diffracted light from the grating mark and superimposing a reference coherent image of a reference mark, having different periodicity from and no interfering connection with the mark coherent image, onto the image pickup means, and a processing means for selecting a spatial frequency component of a beat signal inherent in a composite video signal formed by superimposition and detecting the position of the grating mark on the basis of the phase of the spatial frequency component.

The light from the illuminating means is a light having a wavelength which does not expose a photoconductive member applied on the second object.

The forming means takes the refracted and diffracted light from the grating mark out of the exposure optical path after the light passes through the projection optical system again.

The projection exposure apparatus further comprises a control means for placing the second object at the required position by using the mark coherent image before projecting the reference coherent image onto the solid-state image pickup device.

In addition, the invention provides means for positioning the object using the above described exposure apparatus.

Other objects and aspects of the invention will become apparent from the following description of embodiments with reference to the accompanying drawings.

BRIEF DESCRIPTION OF THE DRAWINGS

FIG. 1 is a schematic view of the principal part of a projection exposure apparatus to which the present invention is applied.

DESCRIPTION OF THE PREFERRED EMBODIMENTS

Figure 2A:
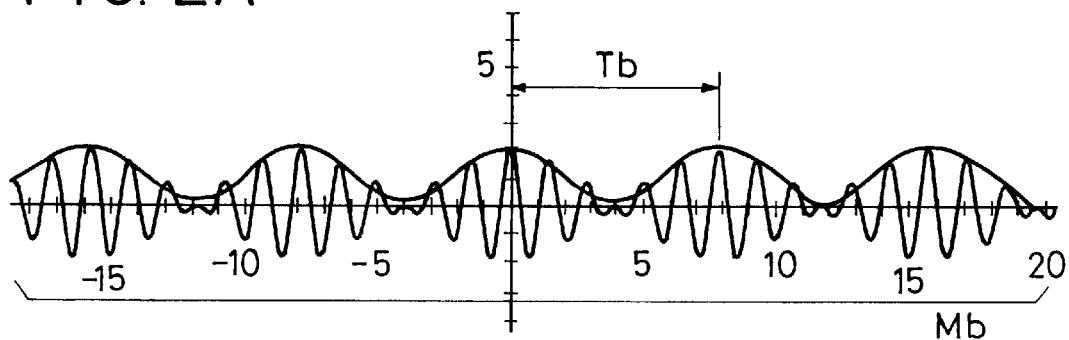
FIGS. 2A, 2B and 2C are waveforms of coherent signal images to be detected in the apparatus of FIG. 1.

FIG. 1 is a schematic view of the principal part of a projection exposure apparatus according to the present invention. Referring to FIG. 1, an electronic circuit pattern on a reticle R (first object) is illuminated by exposure light from an illumination device IL and projected in a reduced size onto a wafer W (second object) which is positioned on a wafer stage ST. The exposure light passes through a projection lens (projection optical system) 1 and thereby transfers the electronic circuit pattern to the wafer W by exposure.

Next, components of an aligning means shown in FIG. 1 will be described. The aligning means includes a detection optical system 53 having a reference mark Gs fixed thereon, an image pickup unit 101 having a solid-state image pickup device 14, and a wafer mark GW (also called grating mark or alignment mark) formed on the wafer surface.

In this embodiment, the position of the reticle R relative to the projection lens 1, the detection optical system 53 and the image pickup unit 101 is first ascertained by an appropriate detection system. Furthermore, the reticle R and the wafer W are aligned indirectly by detecting the positions of projection images of the reference mark Gs in the detection optical system 53 and the wafer mark GW of the wafer W on an image pickup device 14 of the image pickup unit 101.

Next, the detection of the position of the wafer mark GW on the wafer W and the placement of the wafer W at a required position will be described. A light beam radiated from a linearly polarizing He-Ne laser 2 and having a wavelength $\lambda$ different from that of the exposure light from the illumination device IL is directed to enter an acousto-optical modulator (AO modulator) 3, which controls the amount of light incident on a lens 4. It is possible, for example, that the light beam will be completely cut off in a certain state.

The light beam, after passing through the AO modulator 3, is condensed by the lens 4, and is directed to enter a polarizing beam splitter 5 after the illumination area of the beam is limited spatially by a field stop SIR located on a plane which is optically conjugate with the wafer W. The light beam is then reflected by the polarizing beam splitter 5, and thereafter it passes through a quarter-wave plate 6, a lens 7, a mirror 8, a lens 19 and the projection lens 1, whereby it illuminates the wafer mark GW on the wafer W from the vertical direction, i.e. perpendicular thereto.

Figure 4A:
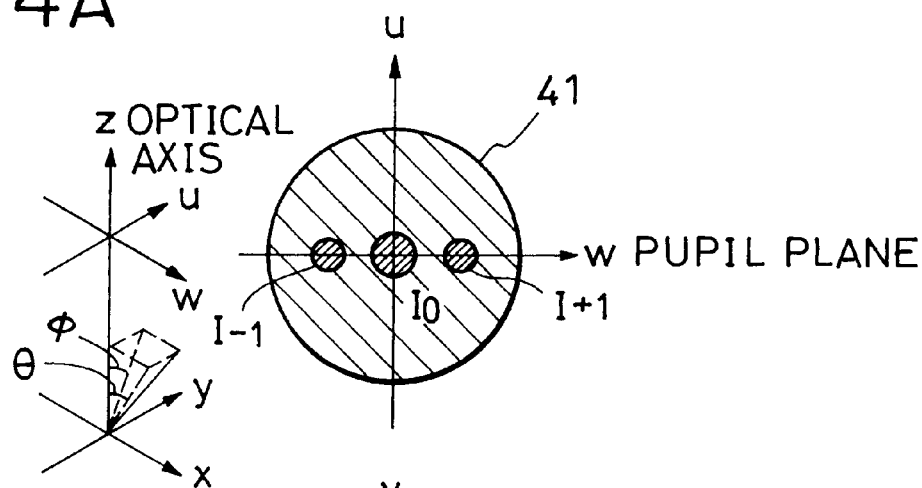
FIG. 4A and 4B are explanatory views of a pupil plane of an observation optical system and a grating mark according to the present invention.

As shown in FIG. 4A, the illumination light is a beam 41 on a pupil plane of the optical system composed of the projection lens 1, the lens 7 and the lens 19 (FIG. 1.) The pupil plane is a Fourier-transform plane of an image plane at the wafer surface W as shown in FIG. 4A, which enters the wafer surface W almost perpendicularly. As shown in FIG. 4A, u and w are coordinates of the pupil plane and represent the distribution of incident angle of the illumination light with respect to the wafer surface W.

Figure 4B:
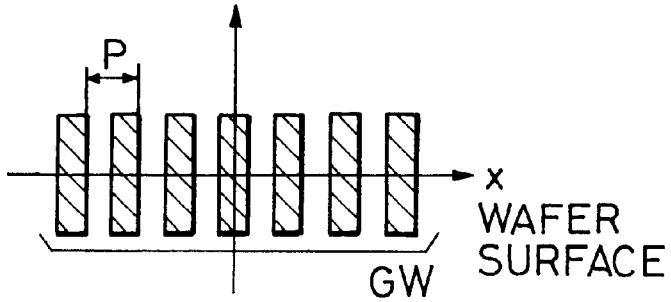

The wafer mark GW on the wafer W is a grating mark formed of a diffraction grating with a pitch P as shown in FIG. 4B. Diagonally shaded areas and the unshaded intermediate areas of the diffraction grating represent different levels, refractive indexes, phases or the like, whereby the diffraction grating is formed.

The light beam reflected and diffracted by the wafer mark GW passes through the projection lens 1 and thereafter sequentially passes through the lens 19, the mirror 8, the lens 7, the quarter-wave plate 6, the polarizing beam splitter 5, a lens 9 and a beam splitter 10. The reflected and diffracted beam then forms an aerial image of the wafer mark GW at a plane F.

The aerial image of the wafer mark GW formed at the plane F then passes through a Fourier-transform lens 11 and a stopper 12. Only a beam of the light reflected and diffracted by the wafer mark GW, for example, which forms an angle of $\pm\sin^{-1}(\lambda/P)$ with the wafer W, is transmitted by the stopper 12. The beam is passed through a Fourier-transform lens 13, whereby a coherent image of the wafer mark GW is formed on the solid-state image pickup device 14 as an image pickup means.

Since this coherent image corresponds to the wafer mark GW which was illuminated by monochromatic light and formed by a diffraction grating with the pitch P, the light amount associated with the image and the contrast thereof are much higher and more stable than those of a dark field image formed by using simple scattered light.

The lenses 19, 7 and 9 constitute a correcting optical system 51 which corrects aberration caused at the projection lens 1 with respect to the wavelength of the illumination light for the wafer mark GW, mainly, axial chromatic aberration, chromatic aberration of magnification, spherical aberration and the like.

The correction optical system 51 in this embodiment does not need to correct aberration with respect to all beams incident thereon, but needs to correct aberration for only the reflected and diffracted light beam passing through the stopper 12. Therefore, the structure of the optical system is extremely simple.

This is quite effective in the use of what is called an excimer stepper utilizing light from an excimer laser as exposure light because the amount of aberration for illumination light is much larger than that of a projection exposure apparatus using g and i rays.

Figure 3:
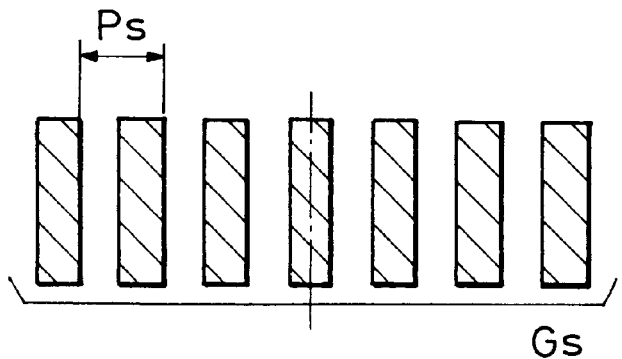
FIG. 3 is an explanatory view showing the shape of a reference mark used in the apparatus of FIG. 1.

On the other hand, in this embodiment, a light beam having a wavelength different from that of the illumination light for the wafer mark GW is emitted from a light source 15, such as an LED (light emitting diode). The light beam is condensed by a condenser lens 16, and illuminates the reference mark Gs which is formed on a reference mask in the detection optical system 17. The reference mark Gs takes the form of, for example, a grating mark similar to the wafer mark GW as shown in FIG. 3. The reference mark Gs is also imaged onto the solid-state image pickup device 14 at an imaging magnification which is determined by the optical system located between the grating mark and the solid-state image pickup device 14. The image of the grating mark is formed at such a position as not to interfere with interference fringes of the wafer mark GW. The spatial frequency of the image of the reference mark Gs is a little different from that of the interference fringes of the wafer mark GW.

In FIG. 3, the diagonal shading represents areas that are transparent and the intermediate, clear regions represent areas that are opaque. The beam passing through the reference mark Gs is condensed by a lens 18 and passes through the beam splitter 10. The beam splitter 10 reflects the beam from the LED 15 and transmits the beam from the He-Ne laser 2 therethrough, thereby forming an aerial image of the reference mark Gs on the F plane. After that, the aerial image of the reference mark Gs on the F plane is imaged onto the solid-state image pickup device 14 by the Fourier-transform lenses 11 and 13 in a manner similar to the wafer mark GW.

In this embodiment, aberration of an optical system 52 constituted by the Fourier-transform lenses 11 and 13 is corrected excellently with respect to the two beams having different wavelengths for illuminating the reference mark Gs and the wafer mark GW respectively.

The stopper 12 transmits both a diffraction light, whose reflection angle with respect to the wafer mark GW is $\pm\sin^{-1}$ ($\lambda$/P), and a diffraction light whose reflection (transmission) angle with respect to the reference mark Gs is $\pm\sin^{-1}$ ($\lambda$s/Ps) ($\lambda$s represents the wavelength of the light from the LED 15, and Ps represents the grating pitch of the reference mark Gs). The stopper 12 cuts off diffraction light of other orders.

In this embodiment, the stopper 12 acts as a pupil plane filter on the intensity distribution of the reflected light from the wafer mark GW when the illumination light enters the wafer W. As a result, only $\pm$n-order diffraction light from the wafer mark GW enters the solid-state image pickup device 14, wherein n=1, 2, 3, . . .

Figure 2B:
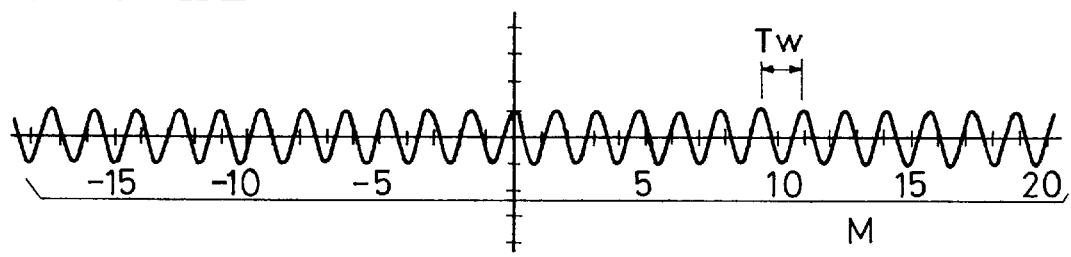

Only $\pm$1-order diffraction light is employed in this embodiment. On the solid-state image pickup device 14, a coherent image M of the wafer mark GW is formed as shown in FIG. 2B. The intensity distribution of this coherent image M is represented by a cosine function having a cycle Tw, which is equal to $\beta$w·P/2. ($\beta$w represents the imaging magnification of the wafer mark GW.) The phase of the cosine function includes information about the shift of the wafer mark GW on the wafer W from the optical axis.

No matter how the level of the wafer mark GW or the thickness of a resist covering the surface of the wafer mark GW varies, the coherent image M forms a desired intensity distribution as a cosine function having the cycle Tw.

There is no need to limit diffraction light to be selected by the stopper 12 to only the $\pm$1-order diffraction light, and a pupil filter for transmitting only $\pm$n-order (n=1, 2, 3, . . . ) diffraction light therethrough may be used.

Such a wide selection of orders corresponds to a wide selection of wavelengths, and this enhances the detection rate of the wafer mark GW. For example, if the amount of the $\pm$1-order diffraction light is small, the detection rate of the wafer mark GW may be increased by using a $\pm$2-order diffraction light.

At this time, the beams emerging from the wafer W at an angle of $\pm\sin^{-1}$ (n$\lambda$/P) pass through the stopper 12 and are imaged onto the solid-state image pickup device 14. The intensity distribution of the cosine function with the cycle Tw (which is equal to $\beta$w·P/(2n)) is detected by the solid-state image pickup device 14.

In using the stopper 12 for transmitting only $\pm$n-order diffraction light (n=1, 2, 3, . . . ), a diffraction light with a reflection (transmission) angle of $\pm\sin^{-1}$ (n$\lambda$s/Ps) with respect to the reference mark Gs is selected.

In this connection, since the diffraction efficiency of the reference mark Gs does not change, it is substantially needless to change the diffraction light in accordance with the changes of the wafer mark GW. It is possible to interpose the beam splitter 10 between the lens 13 and the solid-state image pickup device 14. In this regard, the same diffraction light can be always used regardless of change of the stopper 12. (The stopper 12 is necessary only for the reference mark Gs.) It is substantially insignificant for the present invention no matter which position is taken for the beam splitter 10.

Figure 2C:
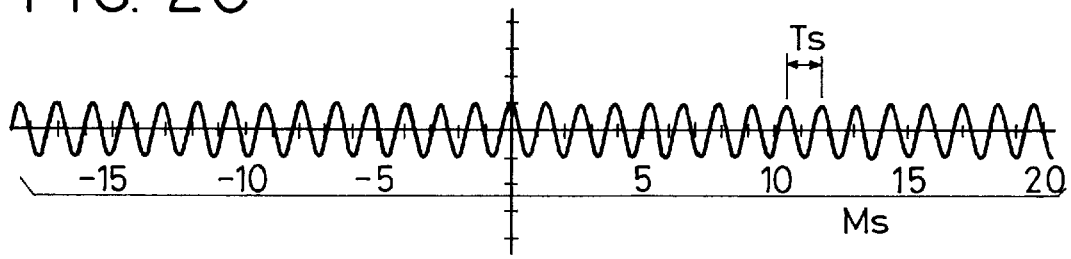

Conventionally, the positional information about the wafer mark GW is measured from only the coherent image M of the wafer mark GW formed on the solid-state image pickup device 14 as shown in FIG. 2B. In the present invention, the positional information about the wafer mark GW is found by simultaneously forming a coherent image Ms of the reference mark Gs on the solid-state image pickup device 14 as shown in FIG. 2C, obtaining a signal image Mb shown in FIG. 2A as a beat signal by superimposition of the coherent images, and detecting the phase difference of the frequency (cycle Tb) of the beat signal image Mb in FFT.

The coherent image M of the wafer mark GW is represented by a cosine function having a cycle of Tw, which is given by the formula Tw=$\beta$w·P/2 as shown in FIG. 2B. ($\beta$w represents imaging magnification of the wafer mark GW). The coherent image Ms of the reference mark Gs is represented by a cosine function having a cycle of Ts, which is given by the formula Ts=$\beta$s·Ps/2 as shown in FIG. 2C. ($\beta$s represents imaging magnification of the reference mark Gs). These two coherent images are simultaneously formed on the solid-state image pickup device 14. Since the coherent images are formed from different light sources and have different wavelengths, they do not interfere with each other. The beat signal image Mb shown in FIG. 2A is formed by adding signal strengths of the coherent images.

At this time, the cycle Tb of the beat signal is defined by the formula Tb=1/(|1/Tw−1/Ts|). The beat signal image Mb shifts in response to the shift of the wafer mark GW and with a sensitivity Tb/Tw times as high as the wafer mark GW.

For example, when Tw=4 mm and Ts=5 mm on the solid-state image pickup device 14, Tb=20 mm. Therefore, the shift of the wafer mark GW can be observed in a size magnified five times by observing the beat signal image Mb.

With such attention to the beat signal image Mb, this embodiment makes it possible to improve the measuring power without increasing the imaging magnification of the optical system, and to prevent the detection rate from being lowered owing to an insufficient amount of light with an intention of increasing the signal strength of the coherent image M of the wafer mark GW. The signal image Mb has a signal pattern as shown in FIG. 2A, and is symmetrical with respect to a pattern center to be found.

Referring to FIG. 1, a pattern image, which is converted into electric signals by the image pickup unit 101, is converted by means of an analog to digital (A/D) converter 102 into a train of discrete electric signals in accordance with pixel addresses by a sampling pitch determined by the pixel pitch of the image pickup plane.

When a two-dimensional image pickup device is used, an integrator 103 carries out pixel integration in a non-measuring direction and forms a train of one-dimensional electric signals arranged in a measuring direction (this process is unnecessary in the use of a one-dimensional image pickup device).

An FFT arithmetic unit 104 converts the input train of electric signals into a spatial frequency region by discrete Fourier transform, and calculates the Fourier coefficients at a high speed. At this time, a great amplitude (Fourier coefficient) appears at the spatial frequency inherent in the pattern according to periodicity of the pattern. In the spatial frequency region of the signal image Mb, great amplitudes appear at spatial frequencies corresponding to the cycles Tw, Ts and Tb.

A frequency and amplitude detector 105 detects a frequency representing the peak amplitude in a region near the spatial frequency inherent in the pattern. Even if the optical magnification changes from a required value for some reason, for example, an adjustment condition of the optical system, such frequency detection makes it possible to correct the change of the optical magnification in accordance with the spatial frequency inherent in the pattern.

In detecting the peak frequency, the frequency resolution may be enhanced by using an interpolating means (for example, least-square approximation or weighted averaging) in the spatial frequency region as needed. A phase detector 106 detects phases of the spatial frequency inherent in the pattern and frequency components adjacent thereto.

A shift amount detector 107 calculates the amounts of shift of the phases calculated by the phase detector 106 from a reference point in real space. At this time, the shift amounts from the reference point at the center of the pattern may be subjected to weighted averaging by conducting weighted averaging on the levels of spatial frequencies adjacent to the spatial frequency inherent in the pattern. A signal processing method employed in a signal processing system 200 constituted by the units from the A/D converter 102 to the shift amount detector 107 is the same as conventional methods except that the spatial frequency inherent in the pattern to be processed is a spatial frequency in accordance with the cycle Tb of the beat signal image Mb.

As the signal processing method, for example, the method disclosed by the present applicant in Japanese Patent Laid-Open No. 5-343291 is applicable.

The shift amount found by the shift amount detector 107 is transmitted to an alignment control unit 108 and used in combination with previously detected data on the relative positions of the reference mark Gs and the reticle R. The alignment control unit 108 controls the wafer stage ST so as to align the reticle R and the wafer W with each other.

Although the scope for measuring the position of the wafer W in the X direction only is described in this embodiment, in general, grating marks are formed in both the X and Y directions respectively on the wafer W to be aligned; and X-direction and Y-direction measurement scopes are prepared for the grating marks, respectively. As another method within this invention, a checkered mark may be formed on the wafer W so that the shift amounts in the X and W directions are detected by a single scope simultaneously or alternately.

Next, a second embodiment of the present invention will be described. In this embodiment, after the wafer W is placed at a required position by utilizing only the coherent image M of the wafer mark GW, the coherent image Ms of the reference mark Gs is projected and superimposed on the coherent image M of the wafer mark GW, and the wafer W is placed at the required position on the basis of the beat signal image Mb generated by superimposition. In other words, the second embodiment is characterized by adoption of two detection steps, that is, rough and precise detection steps.

In the first embodiment, the coherent image M (cycle Tw) of the wafer mark GW and the coherent image Ms (cycle Ts) of the reference mark Gs are simultaneously formed on the solid-state image pickup device 14, the signal image Mb is formed by superimposing the signal strengths thereof, and the phase difference of the frequency of the beat signal of the signal image Mb is detected in FFT processing, thereby finding positional information about the wafer mark GW. In this method, the measuring range becomes narrow with the increase in measuring sensitivity.

Accordingly, in the second embodiment, after the wafer W is loaded into the apparatus, the alignment control unit 108 carries out rough detection to place the wafer W at a required position by using only the coherent image M of the wafer mark GW without projecting the coherent image Ms of the reference mark Gs onto the solid-state image pickup device 14. Then, the coherent image Ms of the reference mark Gs is projected onto the solid-state image pickup device 14, and is overlaid on the coherent image M of the wafer mark GW. Furthermore, precise detection is carried out to find the positional information about the wafer W by detecting the phase difference of the frequency of the beat signal from the superimposed signal image Mb in FFT processing, thereby placing the wafer W at the required position more precisely.

This second embodiment is effective in that rough detection, having low measuring power and a wide detection area, and precise detection, having a narrow detection area and high measuring power can be switched by minor changes. That is, switching may take place between a projection mode, for projecting the coherent image Ms of the reference mark Gs onto the solid-state image pickup device 14, and a non-projection mode, by changing of the inherent frequency used for phase difference detection in FFT processing.

The second embodiment achieves coexistence of rough detection and precise detection, which generally requires the switching of imaging magnification of the measuring optical system and preparation of separate optical systems, with no need of any object to be driven and any change in position of the wafer W. Therefore, high precision and processing speed can be obtained.

By providing several types of grating pitches Ps for the coherent image Ms of the reference mark Gs, detection steps can be changed from two steps, rough detection and precise detection, to multiple steps. In this case, the reference mark Gs is changed in response to the switching between rough detection and precise detection, or the reference mask 17 is formed of a liquid crystal substrate, the reference mark Gs is formed by powering the liquid crystal on or off, and the liquid crystal is so controlled as to change the grating pitch of the reference mark Gs as needed.

Figure 5:
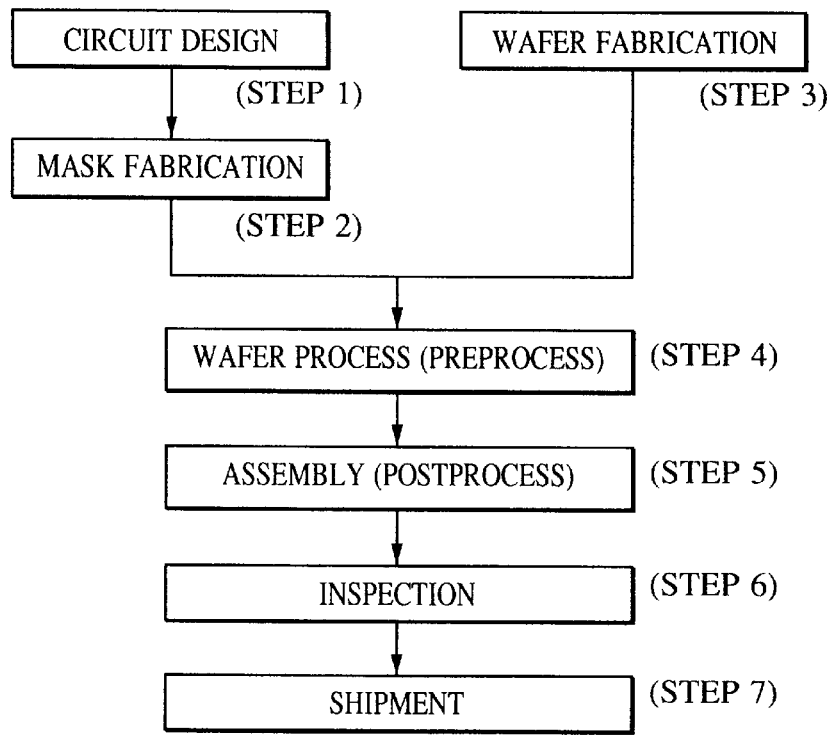
FIG. 5 is a flowchart showing semiconductor device manufacturing processes according to the present invention.

FIG. 5 is a flowchart showing processes of manufacturing a semiconductor device (a semiconductor chip such as an IC or an LSI, a liquid crystal panel, a CCD and the like).

In Step 1 (circuit design), circuit design of the semiconductor device is performed. In Step 2 (mask fabrication), a mask on which the designed circuit pattern is formed is fabricated.

On the other hand, in Step 3 (wafer fabrication), a wafer is fabricated by using a material such as silicon. In Step 4 (wafer process) called preprocess, an actual circuit is formed on the wafer by lithography using the above prepared mask and wafer.

In the next Step 5 (assembly) called postprocess, a semiconductor chip is manufactured by using the wafer fabricated in Step 4, and an assembly process (dicing, bonding), a packaging process (chip sealing) and the like are included in this step.

In step 6 (inspection), the semiconductor device manufactured in Step 5 is subjected to a performance test, an endurance test, and the like. The semiconductor device is completed through these steps, and shipped (Step 7).

Figure 6:
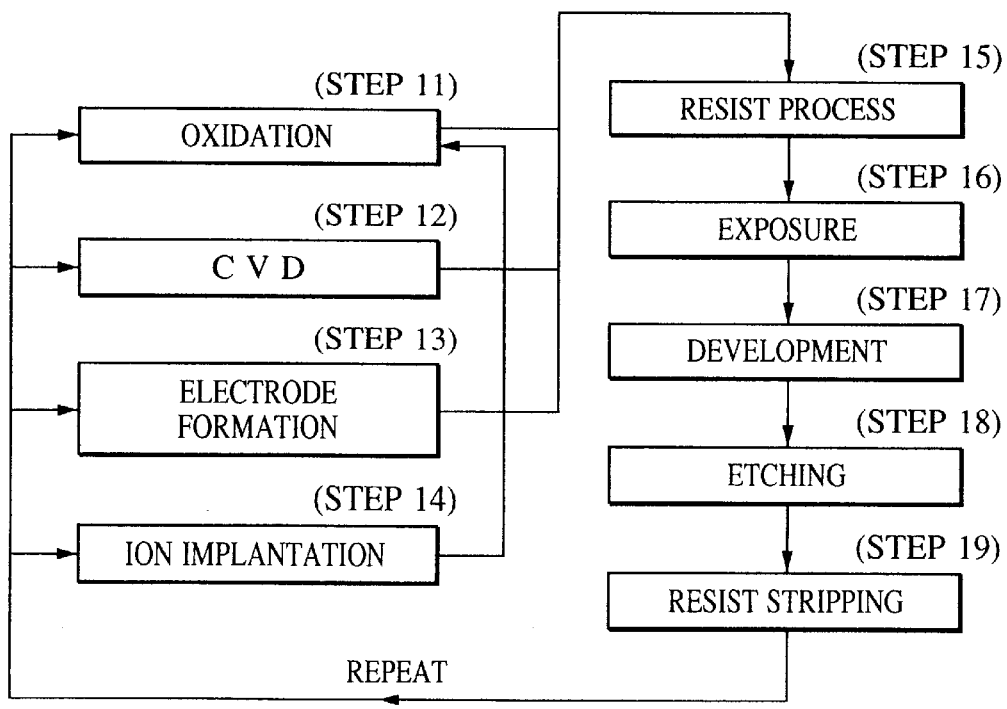
FIG. 6 is a flowchart showing a wafer forming process according to the present invention.

FIG. 6 is a detailed flowchart of the above wafer process. In Step 11 (oxidation), the surface of the wafer is oxidized. In Step 12 (CVD), an insulating film is formed on the surface of the wafer.

In Step 13 (electrode formation), electrodes are formed on the wafer by evaporation. In Step 14 (ion implantation), ions are implanted into the wafer. In Step 15 (resist process), a photosensitive material is applied on the wafer. In Step 16 (exposure), the circuit pattern of the mask is printed on the wafer through exposure by the above-mentioned exposure apparatus.

In Step 17 (development), the exposed wafer is developed. In Step 18 (etching), parts other than the developed resist image are cut away. In Step 19 (resist stripping), the resist which are unnecessary after etching is removed. By repeating these steps, multiple circuit patterns are formed on the wafer.

The use of the manufacturing method mentioned above makes it possible to manufacture a highly integrated semiconductor device easily.

What is claimed is:

1. A method for placing an object at a required position, comprising the steps of:

illuminating a grating mark formed on said object with a light beam from a first light source;

forming a mark coherent image corresponding to the grating mark on an image pickup means by using ±n-order light (n=1, 2, 3, . . . ) of reflected and diffracted light from the grating mark and superimposing a reference coherent image of a reference mark, having different periodicity from and no interfering connection with the mark coherent image, onto the mark coherent image on said image pickup means; and selecting a spacial frequency component of a beat signal inherent in a composite video signal formed by superimposition of the reference coherent image onto the mark coherent image; and detecting the position of the grating mark on the basis of the phase of the spatial frequency component, said reference coherent image of a reference mark being formed by illuminating the reference mark with a light beam from a second light source different from said first light source, and by using diffracted light from the reference mark.

2. A method according to claim 1, further comprising the step of:

placing said object at the required position by using the mark coherent image before projecting the reference coherent image onto said image pickup means.

3. A projection exposure apparatus for projecting a pattern formed on a first object onto a second object with exposure light through a projection optical system, comprising:

illuminating means for illuminating a grating mark formed on said second object;

forming means for forming a mark coherent image corresponding to the grating mark on an image pickup means by using ±n-order light (n=1, 2, 3, . . . ) of reflected and diffracted light from the grating mark and superimposing a reference coherent image of a reference mark, having different periodicity from and no interfering connection with the mark coherent image, onto the mark coherent image on said image pickup means; and processing means for selecting a spacial frequency component of a beat signal inherent in a composite video signal formed by superimposition of the reference coherent image and the mark coherent image; and detecting the position of the grating mark on the basis of the phase of the spatial frequency component, said reference coherent image of a reference mark being formed by illuminating the reference mark with a light beam from a light source different from said illuminating means, and by using diffracted light from the reference mark.

4. A projection exposure apparatus according to claim 3, wherein the light from said illuminating means has a wavelength which does not expose a photoconductive member applied on said second object.

5. A projection exposure apparatus according to claim 4, wherein said forming means takes refracted and diffracted light from the grating mark out of an exposure optical path after the light passes through said projection optical system again.

6. A projection exposure apparatus according to claim 3, further comprising:

control means for placing said second object at the required position by using the mark coherent image and then projecting the reference coherent image onto a solid-state image pickup device.

7. A positioning method for placing an object at a required position, comprising the steps of:

illuminating a grating mark formed on said object with a light beam from a first light source;

forming a mark coherent image corresponding to the grating mark on an image pickup means by using ±n-order light (n=1, 2, 3, . . . ) of reflected and diffracted light from the grating mark and superimposing a reference coherent image of a reference mark, having different periodicity from and no interfering connection with the mark coherent image onto said mark coherent image on said image pickup means; and selecting a spacial frequency component of a beat signal inherent in a composite video signal formed by superimposition of the reference coherent image and the mark coherent image; and detecting the position of the grating mark on the basis of the phase of the spatial frequency component; and moving said object to a position corresponding to said phase of said spacial frequency component, said reference coherent image of a reference mark being formed by illuminating the reference mark with a light beam from a second light source different from said first light source, and by using diffracted light from the reference mark.

8. An object positioning device comprising:

illuminating means for illuminating a grating mark formed on said object;

forming means for forming a mark coherent image corresponding to the grating mark on an image pickup means by using ±n-order light (n=1, 2, 3, . . . ) of reflected and diffracted light from the grating mark and superimposing a reference coherent image of a reference mark, having different periodicity from and no interfering connection with the mark coherent image onto the mark coherent image on said image pickup means; and processing means for selecting a spacial frequency component of a beat signal inherent in a composite video signal formed by superimposition of the reference coherent image and the mark coherent image; and detecting the position of the grating mark on the basis of the phase of the spatial frequency component; and means for positioning said object based on the selected spacial frequency component, said reference coherent image of a reference mark being formed by illuminating the reference mark with a light beam from a light source different from said illuminating means, and by using diffracted light from the reference mark.

9. A positioning method according to claim 7, further comprising the step of:

placing said object at the required position by using the mark coherent image before projecting the reference coherent image onto said image pickup means.

10. An object positioning device according to claim 8, wherein the light from said illuminating means has a wavelength which does not expose a photoconductive member applied on said object.

11. An object positioning device according to claim 10, wherein said forming means takes refracted and diffracted light from the grating mark out of an exposure optical path after the light passes through said projection optical system again.

12. An object positioning device according to claim 8, further comprising:

control means for placing said second object at the required position by using the mark coherent image and then projecting the reference coherent image onto a solid-state image pickup device.

13. A projection exposure apparatus for projecting a pattern formed on a first object onto a second object with exposure light through a projection optical system, comprising:

a coherent light source;

a first optical system positioned between said coherent light source and the second object, said first optical system guiding light from said coherent light source to a grating mark formed on the second object;

an image pickup device;

a second optical system, positioned between said image pickup device and the second object, said second optical system forming a mark coherent image corresponding to the grating mark illuminated by the light from said coherent light source on said image pickup device by using ±n-order light (n=1,2,3, . . . ) of reflected and defracted light from the grating mark, said second optical system including a reference mark and a guiding optical system guiding light from the reference mark to said image pickup device so as to form a reference coherent image of the reference mark having different periodicity from and no interfering connection with the mark coherent image on said image pickup means and superimposing the reference coherent image onto the mark coherent image on said image pickup device; and a signal processing system receiving a detection signal from said image pickup device, said signal processing system having a function of selecting a spacial frequency component of a beat signal inherent in a composite video signal formed by superposition and a function of detecting the position of the grating mark on the basis of the spacial frequency component, said reference coherent image of a reference mark being formed by illuminating the reference mark with a light beam from a second light source different from the said coherent light source, and by using diffracted light from the reference mark.

14. A method according to claim 1, wherein said second light source emits a light beam of a wavelength different from that of said light beam from a light source which illuminates a grating mark.

15. An apparatus according to claim 3, wherein said second light source emits a light beam of a wavelength different from that of said light beam from said first light source which illuminates a grating mark.

16. A method according to claim 7, wherein said second light source emits a light beam of a wavelength different from that of said light beam from said first light source which illuminates a grating mark.

17. An apparatus according to claim 8, wherein said second light source emits a light beam of a wavelength different from that of said light beam from said illuminating means which illuminates a grating mark.

18. An apparatus according to claim 13, wherein said second light source emits a light beam of a wavelength different from that of said light beam from said coherent light source.

* * * * *